March 21, 1961 M. R. BURNS 2,976,489
BLOCKING OSCILLATOR
Filed Aug. 8, 1956
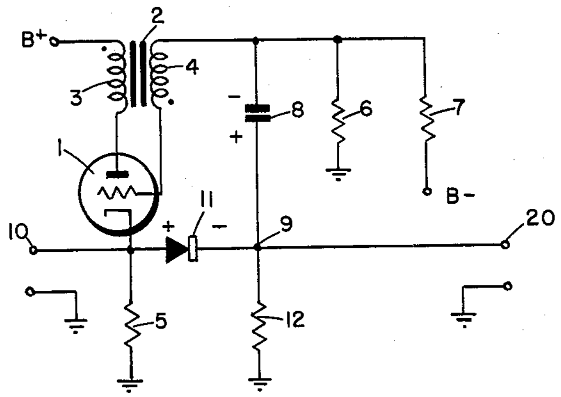
INVENTOR.
MAURICE R. BURNS
BY Harold J. Downes
ATTORNEY United States Patent Office 2,976,489

Patented Mar. 21, 1961

2,976,489

BLOCKING OSCILLATOR

Maurice R. Burns, Santa Ana, Calif., assignor to North American Aviation, Inc.

Filed Aug. 8, 1956, Ser. No. 602,755

11 Claims. (Cl. 328—55)

This invention pertains to blocking oscillators and more particularly to a single swing blocking oscillator whose input and output are intercoupled to provide a precision delay pulse generator.

In the field of radar a vital part of distance or time measuring systems is a circuit for generating a rectangular wave form of short duration. The circuit, commonly called a range mark generator, must produce a substantially square wave upon actuation from a switching wave form. In addition, accurate time measurement requirements necessitate a reproducibility of the switching wave form such that the transmitted pulse output of the range mark generator occurs at a constant time delay after the initiating signal from the switching wave form.

One of the more frequently used circuits in present day radars to generate a range mark pulse is a blocking oscillator circuit. Such a circuit is shown on page 70 of vol. 20 of the Radiation Laboratory Series published by McGraw-Hill. In order to maintain a stable low impedance load on the blocking oscillator a trigger amplifier is used to couple the switching wave form to the blocking oscillator (range mark generator). However, since the time it takes the blocking oscillator to generate a range mark pulse is directly proportional to the load impedance presented by the blocking oscillator to the incoming actuating pulse, there is a variable time delay between input actuating pulse and output range mark pulse due to the variation in impedance of the trigger amplifier tube which is continually changing with changes in filament voltage. This variation in time delay between input and output pulses of the range mark generator produces a substantial error in time measurement.

According to the device of the present invention, a high impedance negative trigger input is applied to the cathode of a blocking oscillator tube and a low impedance output is taken from the same cathode through a unidirectional coupling device. Utilizing a circuit which combines a rectifier with a high impedance input load resistor and a low impedance output load resistor, a high impedance load is presented by the cathode of the oscillating tube when the trigger pulse is applied to said cathode; and a low impedance load is presented to the cathode of the oscillating tube when the blocking oscillator produces an output pulse at the cathode. Thus, the input signal is applied to the cathode and the output signal is taken from the cathode. Applying the input signal to the same point from which the output signal is taken provides a circuit which greatly reduces errors inherent in present day range mark generators. The addition of this circuit eliminates the need for the associated amplifier and buffer tubes commonly in use today in radar systems thereby eliminating the variable time delay error caused by these circuits.

It is therefore an object of this invention to provide an improved blocking oscillator.

It is another object of this invention to provide a pulse generator with improved control over the input trigger circuit.

It is another object of this invention to provide a blocking oscillator with a low output impedance.

It is still another object of this invention to provide an improved range mark generator.

It is a further object of this invention to provide a constant time delay range mark generator.

It is a still further object of this invention to provide means in a blocking oscillator for coupling the input to the output with a constant time delay.

It is a still further object of this invention to provide a single stage blocking oscillator which produces a substantially square wave output upon the impression of a trigger circuit on the input circuit.

It is a further object of this invention to provide a single stage blocking oscillator pulse generator which is triggered by a pulse impressed on the cathode circuit and has its output coupled to said cathode circuit by a unilaterally conductive device.

Other objects of invention will become apparent from the following description taken in connection with the accompanying drawings, in which the single figure is a schematic of the device of the invention.

Referring to the single figure, triode 1 in conjunction with transformer 2 forms a blocking oscillator. The anode of triode 1 is connected through primary winding 3 to the B+ terminal of a direct current voltage source. The cathode of triode 1 is connected through load resistor 5 to ground. The control grid of triode 1 is connected through secondary winding 4 of transformer 3 to one end of resistor 6, which functions as a grid return resistor having its other end connected to ground.

Secondary winding 4 also provides a path for the grid of triode 1 to the B— terminal of the direct current voltage source, one end of winding 4 being connected to the grid, and the other end connected through grid bias resistor 7 to the B— terminal. The B— terminal is at a sufficiently lower voltage than ground to insure cutoff of triode 1 during intervals between input pulses. A storage capacitor 8 has its lower or negative plate connected to the grid of triode 1 through secondary winding 4. The upper, or positive plate, of capacitor 8 is connected to point 9 of the output circuit. The input or control voltage, which is taken from the output of any conventional pulse generator, is applied through terminal 10 to the cathode of triode 1. In the preferred embodiment of this invention input terminal 10 provides a sharp negative trigger pulse to the cathode of triode 1. Unilateral conductive device 11, which may be, for example, a silicon diode rectifier, couples the cathode of triode 1 to point 9 of the output circuit. The anode of diode 11 is connected to the cathode of triode 1, and the cathode of diode 11 is connected to point 9 of the ouput circuit. Also connected to point 9 is resistor 12 which is in parallel with load resistor 5 when diode 11 is conducting. The output pulse, which is substantially a square wave, is taken from terminal 20 which is connected to point 9. The output pulse at terminal 20 depends primarily on the ratio of turns in windings 3 and 4 of transformer 2 for its squareness, on storage capacitor 8 for its width, and on resistors 5 and 12 for its amplitude.

In operation, before a negative trigger pulse is received, triode 1 is nonconducting, being biased to cut off by the B— terminal through resistor 7 and winding 4 to the control grid which causes the grid to be at a negative potential with respect to the cathode. When a negative trigger pulse is received at input terminal 10, there appears at the cathode of triode 1 a pulse of sufficient negative potential with respect to the control grid to cause conduction of triode 1. The polarity of rectifier 11 is such that it is nonconductive to the negative input voltage and therefore the load presented to the pulse at the cathode is the high impedance resistor 5. As the anode current of conducting triode 1 starts to flow, the current flowing through primary winding 3 of transformer 2 causes a magnetic field to be set up in the core of transformer 2 which induces a voltage in secondary winding 4. Secondary winding 4 is so poled that the voltage induced in it makes the lower end of winding 4 positive with respect to the upper end when the voltage across primary winding 3 is positive at the upper end with respect to the lower end, as indicated in the figure by polarity dots. Therefore, the induced voltage in winding 4 causes the grid to go more positive with respect to the cathode increasing the anode current in triode 1. The increase in plate current increases the current through winding 3 which, in turn, induces a still further positive potential on the lower end of winding 4 relative to its upper end, and thereby renders the control grid still more positive. This cumulative effect continues until current flow from the anode to cathode reaches saturation, at which time no further substantial increase of current occurs through primary winding 3. During this time, a charge has been building up on the plates of capacitor 8 rendering its upper plate (connected to winding 4) negative. As soon as triode 1 reaches saturation and the current flowing through winding 3 ceases to increase thereby failing to induce a voltage in winding 4, capacitor 8 starts to discharge thereby causing the potential of the grid to go negative. When the grid starts to go negative, current through triode 1 and primary winding 3 decreases. The decrease in current through winding 3 tends to reverse the polarity of the voltage induced in winding 4 making the lower end connected to the grid negative with respect to the upper end. This causes the grid to become more negative, further decreasing current flow in triode 1. This cumulative effect continues until triode 1 is no longer conducting, at which time capacitor 8 is fully discharged.

Turning now to the operation of the diode 11 during the time the blocking oscillator circuit is in operation, as soon as triode 1 commences conduction, the potential at the cathode thereof, which had been driven negative by the input trigger pulse, rises. Shortly thereafter, at a predetermined voltage level, diode 11 is turned on, switching the output circuit connected to point 9 into the cathode circuit of triode 1. Resistor 12 is now in parallel with resistor 5, and because of the low impedance of resistor 12 compared with resistor 5, the output impedance is substantially that from point 9 through resistor 12 to ground. Thus it can be seen that by inserting diode 11 between the input cathode of triode 1 and the output point 9 so that diode 11 conducts only when the cathode reaches a predetermined level well above the negative input trigger voltage level, a high impedance input may be presented at the cathode of triode 1 and a low impedance output may be provided at the same cathode by means of the coupling diode 11.

In the embodiment of the invention, in order to improve the square wave quality of the output wave form, transformer 2 is selected from ferrite or steel core material, preferably one made of ribbon steel, with a primary to secondary turns ratio of approximately 4 to 3. Storage capacitor 8 which controls the output pulse width may be, for example, 39 micromicrofarads. The ratio of high impedance resistor 5 to low impedance resistor 12 should be 100 to 1 or better. Also, bias resistor 7 should be approximately 25 times greater than grid return resistor 6 to allow current emanating from the grid of triode 1 to flow through resistor 6 when the blocking oscillation process commences.

Although only a preferred embodiment of the invention has been described, it is noted that the disclosed circuit is capable of modification without departing from the scope of the invention. For example, the input to the cathode of triode 1 need not be presented across a high impedance resistor as shown. Resistor 5 can be any ratio to resistor 12 depending upon particular circuit requirements. In addition, a transistor could be substituted for triode 1; for example, in a P-N-P transistor the emitter would be substituted for the anode, the base for the grid, and the collector for the cathode.

Although the invention has been described and illustrated in detail, it is to be clearly understood that the same is by way of illustration and example only and is not to be taken by way of limitation, the spirit and scope of this invention being limited only by the terms of the appended claims.

I claim:

1. In an electronic circuit, an electronic valve, said valve comprising at least an anode, a cathode, and a control element, means for providing direct current operating potentials on said anode and cathode elements, said cathode element providing an electrode for initiating conduction of said valve, a unidirectional output current path connected to said electrode, said unidirectional current path poled in a direction so as to be nonconductive to signals initiating conduction but conductive upon a change in potential of said electrode upon commencement of conduction.

2. In a blocking oscillator comprising an electronic valve having a cathode, anode, and control electrode means for providing direct current operating potentials including a source of direct current having at least two output terminals, said anode responsive to a potential from one of said terminals and said cathode responsive to a potential from the other said terminal, an input circuit connected to said cathode for initiating conduction in said valve, a unidirectional output current path connected between the cathode of said valve and the other said terminal of said direct current source, said path poled in a direction to allow current flow upon the rise in potential of said cathode as said valve conducts.

3. Claim 2 as described wherein said unidirectional current path comprises a diode and a load impedance.

4. A blocking oscillator comprising an electron valve having at least a cathode, a grid, and an anode, a primary winding connected to said anode, a secondary winding inductively coupled to said primary winding and connected to said grid to feed back to said grid at least a portion of the voltage developed across said primary winding, a unilaterally conductive device having one electrode connected to said cathode, and a capacitor connected in series with said secondary winding and the other electrode of said unilaterally conductive device.

5. Claim 4 as described wherein is included means for biasing said electron valve to prevent conduction until triggered.

6. Claim 4 as described wherein is included means for biasing said electron valve to prevent conduction until triggered, said bias means comprising resistor means connected in series circuit with said grid and said cathode.

7. A blocking oscillator comprising an oscillator tube having at least a cathode, a grid, and an anode, a source of direct current potential, a primary winding connected between the positive side of said direct current source and said anode, a secondary winding inductively coupled to said primary winding and connected to said grid to feed back to said grid a portion of the voltage developed across said primary winding, a resistor serially connecting said grid and said secondary winding to the negative side of said direct current source whereby said grid is maintained at a negative potential with respect to said cathode, a unilaterally conductive device having an electrode connected to said cathode, and a capacitor connected in series with said secondary winding and the other electrode of said unilaterally conductive device.

8. Claim 7 as described wherein is included a resistor connecting said grid through said secondary winding to ground.

9. Claim 7 as described wherein is included a resistor connecting said grid through said secondary winding to ground.

10. A blocking oscillator comprising an oscillator tube having at least a cathode, a grid, and an anode, a source of direct current potential, a cathode resistor connecting said cathode to ground, a primary winding connected between the positive side of said direct current source and said anode, a secondary winding inductively coupled to said primary winding and connected to said grid to feed back to said grid at least a portion of the voltage developed across said primary winding, a grid return resistor connecting said grid through said secondary winding to ground, a bias resistor serially connecting said grid and said secondary winding to the negative side of said direct current source to establish said grid at a negative potential with respect to said cathode, a diode rectifier comprising a cathode and an anode, the anode of said rectifier connected to said cathode of said tube, and a capacitor connected in series with the cathode of said rectifier and said secondary winding.

11. Claim 10 as described wherein is included means for biasing said rectifier to cut off when said oscillator tube is nonconducting, said means comprising a diode resistor connected between the anode of said rectifier and ground, the impedance of said cathode resistor being sufficiently higher than the impedance of said diode resistor to prevent said rectifier from conducting when said oscillator tube is nonconducting.

References Cited in the file of this patent

UNITED STATES PATENTS

| | | |
|---|---|---|
| 2,193,850 | Andrieu et al. | Mar. 19, 1940 |
| 2,577,015 | Johnson | Dec. 4, 1951 |
| 2,597,796 | Hindall | May 20, 1952 |
| 2,792,497 | Brooks | May 14, 1957 |